United States Patent [19]
Tong

[11] Patent Number: 5,336,575
[45] Date of Patent: Aug. 9, 1994

[54] METHOD OF PRODUCING CRT SCREENS USING MENISCUS COATING

[75] Inventor: Hua-Sou Tong, Arlington Heights, Ill.

[73] Assignee: Zenith Electronics Corporation, Glenview, Ill.

[21] Appl. No.: 970,744

[22] Filed: Nov. 3, 1992

[51] Int. Cl.$^5$ .............................. B05D 1/30; G03C 5/56
[52] U.S. Cl. ..................................... 430/25; 430/28; 427/157; 427/158
[58] Field of Search ............... 430/25, 28; 427/157, 427/158

[56] References Cited

U.S. PATENT DOCUMENTS

| | | | |
|---|---|---|---|
| 3,526,535 | 9/1970 | Plumat | 117/120 |
| 3,876,465 | 4/1975 | Prazak, III | 117/33.5 C |
| 3,931,442 | 1/1976 | Rollason | 427/346 |
| 4,004,045 | 1/1977 | Stelter | 427/55 |
| 4,370,356 | 1/1983 | Bok et al. | 427/38 |
| 4,828,949 | 5/1989 | Kato et al. | 430/25 |
| 4,938,994 | 7/1990 | Choinski | 427/96 |
| 5,085,888 | 2/1992 | Morimoto et al. | 427/108 |

Primary Examiner—John Kight, III
Assistant Examiner—John M. Cooney, Jr.
Attorney, Agent, or Firm—Roland W. Norris

[57] ABSTRACT

A method of producing luminescent display screens for CRTs using meniscus coating to apply photosensitive slurries to the faceplate, thereby eliminating material waste, reducing particle contamination and improving coating uniformity.

13 Claims, 2 Drawing Sheets

METHOD OF PRODUCING CRT SCREENS USING MENISCUS COATING

BACKGROUND OF THE INVENTION

1. Field of the Invention

The present invention relates generally to the production of luminescent display screens for video display devices, and more particularly to the production of luminescent display screens using meniscus coating techniques for the placement of photosensitive screen element slurries on the screening surface of the faceplate of the video display such as may be found, for example, on color cathode ray tubes (CRTs).

2. Discussion of the Related Art

In the art of CRT screen application there are known many forms of screen deposition. Among these are the well-known photolithographic techniques for color screen formation wherein photosensitive slurries containing the luminescent phosphors are spin coated into films on the faceplate and exposed to light wavelengths actinic to the photosensitive slurry, whereupon the exposed pattern of slurry is washed and baked. In color CRT screens serial light exposures are made to form each of the grille, or black matrix, pattern and red, green and blue phosphor patterns hereinafter generically referred to as "screen elements".

Spin coating requires prewetting of the screening surface and can result in slurry waste, uneven coating thickness, and panel skirt or mask support contamination. Elimination of mask support contamination is especially important for high yield production of tensed-foil shadow mask type CRTs having their mask support structures attached directly to the faceplate, as in the flat tension mask (FTM) CRTs made by the assignee hereof. Also, phosphor content of the slurry must be matched to spin-coating technique in order to provide for uniform phosphor content in the resultant spun film on the faceplate. Currently this limits phosphor content of the slurry to about twenty-five to thirty percent by weight to achieve good phosphor distribution. A higher phosphor content would, of course, result in a brighter screen display.

As a great deal of production process knowledge and equipment for photolithographic display screen production is known and currently available, this technique would be much improved by finding a more efficacious method of applying the screen element slurries to the faceplate. Past attempts to improve slurry application include U.S. Pat. No. 3,876,465 to Prazak, III, which details several drawbacks to spin coating. The coating apparatus disclosed by the Prazak III, patent itself can suffer from imprecise coating thickness control and possible mask support structure contamination from slurry particles.

Therefore, it will be seen that of the known methods for photosensitive screen slurry deposition all have drawbacks in relation to uneven coating thickness which may effect brightness uniformity, the uneconomical waste of materials, and possible slurry contamination of mask support structures leading to charged particle contamination of the finished CRT if left uncorrected.

As per the above discussion, there exists a desiderata in the display industry for a reliable, high quality, even thickness screen element application with a minimum of material waste in the production of CRT phosphor screens.

It is therefore among the objects of the present invention to provide such a system for the production of video display screens through the use of known multiple exposure photolithographic techniques in conjunction with improved placement of photosensitive slurries to provide for accurate phosphor screen pattern production with a minimum waste of the screen materials and reduced possibility of subsequent particulate contamination of the screen, shadow mask or finished display device.

BRIEF DESCRIPTION OF THE DRAWINGS

Other attendant advantages will be more readily appreciated as the invention becomes better understood by reference to the following detailed description and compared in connection with the accompanying drawings in which like reference numerals designate like parts throughout the figures. It will be appreciated that the drawings may be exaggerated for explanatory purposes.

DESCRIPTION OF THE PREFERRED EMBODIMENT

Figure 1:
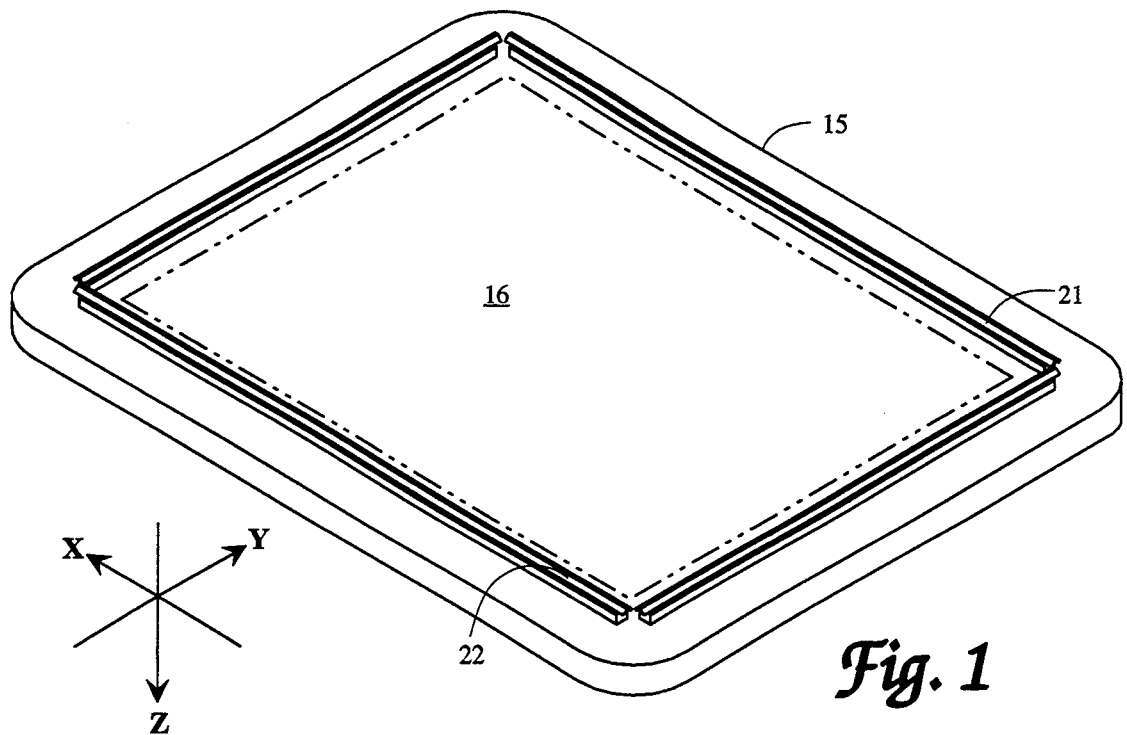
FIG. 1 is a top perspective view of a known flat tension mask color monitor faceplate well suited for applying display screens according to the present invention.

As seen in FIG. 1 a flat display device front panel or faceplate 15, utilized in a color CRT computer monitor made by the assignee hereof, has a screening surface 16 indicated by a dashed line, to which is adhered a black grille or matrix, and blue, green and red-light-emitting phosphors which comprise the screen (not shown). Bounding the screening surface 16 and affixed to the faceplate 15 are at least two opposing mask support structures 21, 22 which will support a tensed foil shadow mask (not shown) in the finished CRT. Ordinary manufacturing practice dictates that the mask support structures 21, 22, hereinafter "rails", be affixed to the faceplate 15 before formation of the screen. During spin coating of the screening surface 16 with phosphor slurries, the rails 21, 22 become coated with the slurry and must be cleaned, representing a labor expenditure, or the slurries clinging to the rails may represent a future source of particle contamination should they flake off the rails and foul the tiny mask apertures or other finished CRT parts. Further, the rails represent a barrier to contact printing apparatus such as silk screens or offset print rollers, mitigating towards the use of photolithographic screen formation on such a faceplate assembly. The present invention is well suited for applying photosensitive screen element slurries to such a faceplate.

Figure 2:
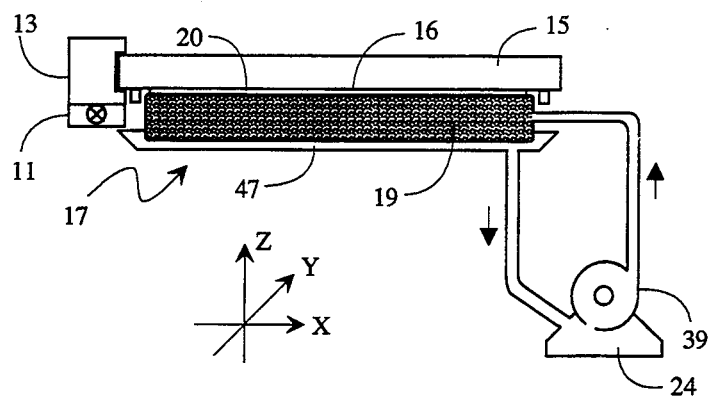
FIG. 2 is a front view of an apparatus suitable for practice of the method of the present invention.

As seen in FIG. 2, a movable track 11 having a clamping system 13 attached thereto is provided for fixing the CRT faceplate 15 in a predetermined position and for the movement of the CRT faceplate above a meniscus coating assembly 17. The coating assembly 17 comprises a meniscus outlet tube 19, for a screen element slurry to be applied as a coating on the screening surface 16.

Reference may be had to U.S. Pat. Nos. 4,370,356 to Bok et al. and 4,004,045 to Stelter for background technical disclosure in the unrelated arts of thin film coating using meniscus producing apparatuses.

As seen in FIG. 2, solutions or suspensions of screen elements are pumped through the porous tube 19 creating menisci 20 of the desired screen element liquid atop the tube. The screening surface 16 of the faceplate 15 is brought into line contact with the menisci 20 by the track 11 and the linear motion of the faceplate 15 produces relative motion between the faceplate 15 and tube 19 to create coatings of the screen elements. Because the faceplate 15 contacts only the menisci 20, variations of faceplate flatness or distance between the faceplate 15 and the tube 19 is insensitive up to approximately ten mils distance. Because the slurry deposited on the screening surface does not move, the phosphor particles are not subject to redistribution, as in spin coating, and therefore a higher percentage of phosphor may be used in the slurry. For example, the phosphor content of a meniscus applied slurry may be from thirty-eight to sixty percent by weight. Because the screening surface 16 faces downwardly, airborne particulate contamination of the screen is minimized.

Again referencing FIG. 2, the tube 19 is designed to deliver a certain constituent screen element liquid, i.e., either black matrix or one of the three phosphor materials, and is attached to a separate screen element reservoir 24 which in turn is attached to a pump 39, for the delivery of the screen element liquid to the tube outlets. Surrounding each tube 19 is a recovery channel 47 for the capture of the screen liquid not deposited by meniscus contact between the tubule 19 and faceplate 15 during screen production.

Figure 3:
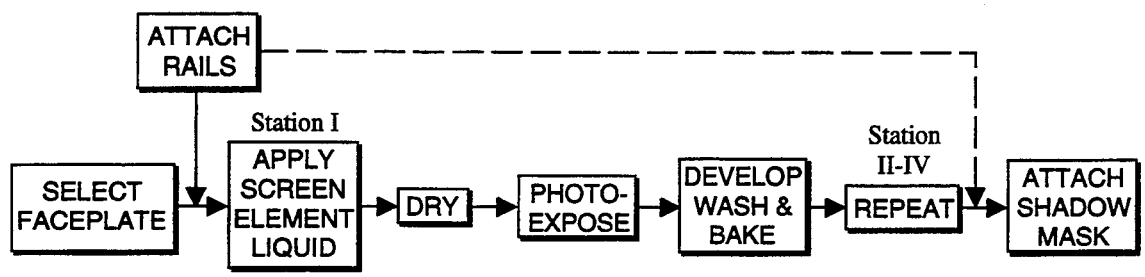
FIG. 3 is a block diagram which illustrates practice of the method according to the present invention.

As seen in the flowchart of FIG. 3, typically the faceplate will have a first photosensitive screen element coating applied at a first meniscus coating station. Commonly this first coating would be a grille slurry containing graphite or a manganese oxide solution. A "screen element liquid" is intended to encompass any liquid which may be used to make a CRT screen, including phosphor-containing slurries or photo-tacky substances, used for a dusting application of phosphor or carbon powders. Next the screen element liquid is dried, resulting in a shrinkage of the coating thickness to approximately that of the final desired screen component. Next the coated faceplate is exposed to light actinic to the photosensitive coating to form the screen element pattern by known techniques. The faceplate is then washed and baked to develop the screen element pattern. The process is then repeated for each screen element until the entire screen is formed. As indicated, rails may be placed on the faceplate before or after the screening process, commonly it is the former. Pore size of the porous tube 19 should average 20 microns to accommodate phosphor particles of up to 15 microns where phosphors are included in the screen element liquid.

Figure 4:
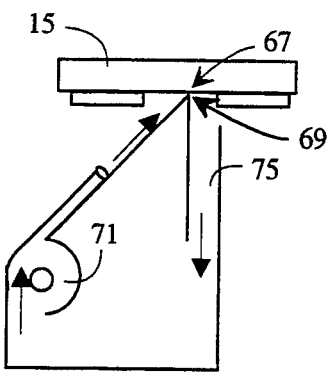
FIG. 4 illustrates an alternative embodiment of a meniscus producing surface.

Alternatively, as seen in FIG. 4, a weir-type meniscus producing surface 67 may be configured with an edge 69 over which a screen element liquid is flowed by use of a pump 71 connected to a delivery channel 73 on one side of the edge 69. A recovery channel 75 is located on the opposite side of the edge 69 from the delivery channel for recovery of unused liquid.

The overall dimensions of the tube 19 will be dictated by the dimensions of the screening surface 16 in the direction of the line of contact between the meniscus and the faceplate 15, whether in the long X axis or short Y axis. The tube 19 would be sized to fit between the rails 21, 22 when the rails are attached to the faceplate 15 prior to screen formation.

Figure 5A:
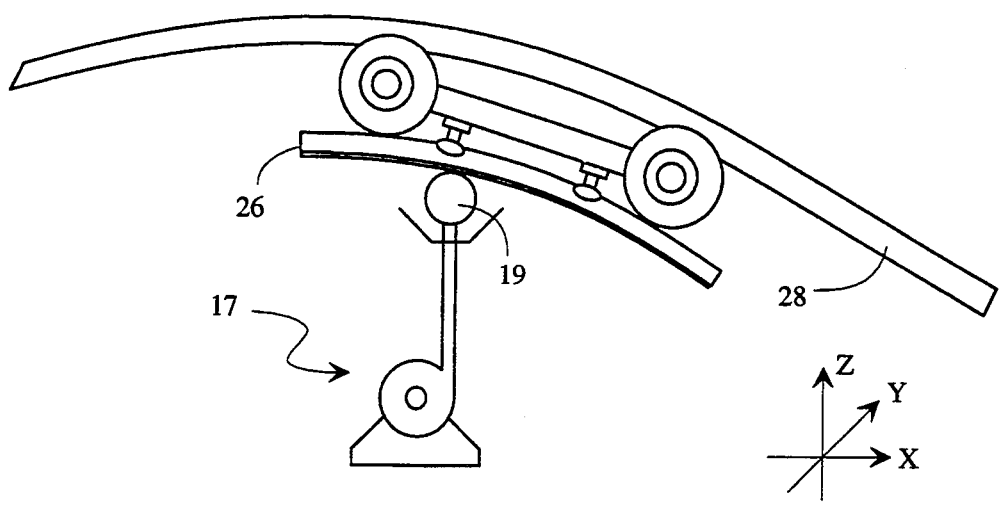
FIGS. 5A and 5B illustrate alternative meniscus coating apparatuses for cylindrical screens.
Figure 5B:
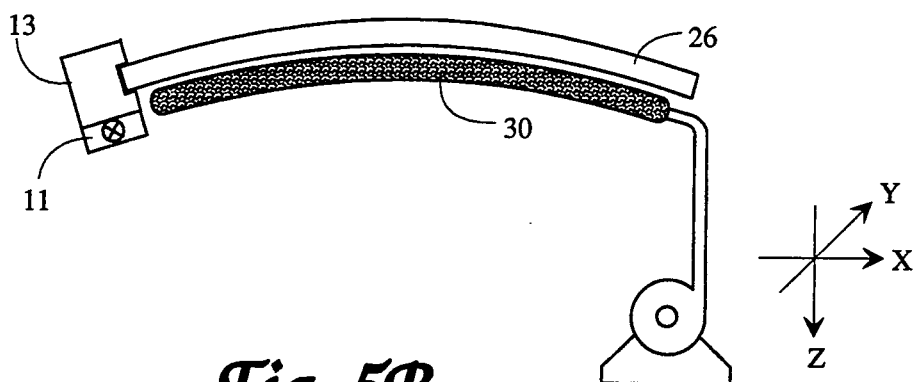

As seen in FIGS. 5A and 5B, the meniscus printing assembly 17 may also be employed to print so called "cylindrical screens" curved in only the X axis. In FIG. 5A a straight tube 19 is located in the Y axis while the cylindrical faceplate 26 is traversed in the X axis in an arc 28 parallel to its curvature over the tube 19. In FIG. 5B a porous tube 30 is curved in the X axis in an arc of like radius to the cylindrical faceplate 26 and the faceplate is traversed over the tube in the Y axis.

It is apparent from the above disclosure that placement of screen element slurries according to the present invention will result in the following advantages:

1) The slurry is placed only where it is needed thus eliminating material waste and mask support, or rail, contamination.

2) the slurry is evenly applied resulting in improved brightness uniformity for the screen of the finished display device.

While the present invention has been illustrated and described in connection with the preferred embodiments, it is not to be limited to the particular structure shown, because many variations thereof will be evident to one skilled in the art and are intended to be encompassed in the present invention as set forth in the following claims:

What is claimed:

1. A method of creating a luminescent display screen for a color CRT comprising:
    a) providing a faceplate with a screening surface on one side thereof;
    b) providing first, second and third meniscus producing devices, each capable of developing a laminar flow of a photosensitive screen element slurry of phosphor particles;
    c) developing a first laminar flow of the first photosensitive screen element slurry over a meniscus producing surface sized to cover only the screening surface of said faceplate;
    d) establishing a line of contact between said screening surface and said laminar flow;
    e) moving said line of contact so as to coat the first photosensitive slurry onto the screening surface to a depth of approximately 25 microns;
    f) exposing the first coated screening surface with light actinic to said first photosensitive slurry and developing the first coated screening surface to produce a first pattern of spaced screen elements fixed to said screening surface and removing unwanted slurry coating; and
    g) repeating steps c-f with second and third photosensitive slurries passing through the second and third meniscus producing devices, respectively.

2. The method of claim 1 including the step of providing a substantially flat faceplate.

3. The method of claim 1 including the step of providing shadow mask supporting surfaces affixed to said faceplate and bounding on at least two opposing sides the screening surface of the faceplate.

4. The method of claim 1 including the step of providing a substantially cylindrical faceplate.

5. The method of claim 1 further comprising providing a porous tube as the meniscus producing surface.

6. The method of claim 5 further comprising providing the porous tube with an average pore size of approximately 20 microns.

7. The method of claim 1 further comprising continuously pumping the photosensitive slurry over the meniscus producing surface.

8. A method of creating a luminescent display screen for a color CRT comprising:
   a) providing a substantially flat faceplate with a screening surface thereon;
   b) providing first, second and third meniscus producing devices, each capable of developing a laminar flow of a photosensitive screen element slurry of phosphor particles and sized to cover only the screening surface of said faceplate;
   c) developing a first laminar flow with the first photosensitive slurry over a meniscus producing surface;
   d) establishing a line of contact between said screening surface and said laminar flow;
   e) moving said line of contact so as to coat the first photosensitive slurry onto the screening surface on said faceplate to a depth of approximately 25 microns;
   f) exposing the first coated screening surface with light actinic to said first photosensitive slurry and developing the first coated screening surface to produce a first pattern of spaced screen elements fixed to said screening surface and removing unwanted slurry coating; and
   g) repeating steps c-f with second and third photosensitive slurries passing through the second and third meniscus producing devices, respectively.

9. The method according to claim 8 further comprising affixing to said faceplate on the screening surface side thereof shadow mask support surfaces bounding said screening surface on at least two sides thereof.

10. The method according to claim 9 including affixing said mask support structures to said faceplate after the application of said luminescent display screen.

11. A method of creating a luminescent display screen for a color CRT comprising:
   a) providing a faceplate with mask supporting structures attached thereto and bounding on two opposing sides a screening surface of the faceplate for holding a tensed foil shadow mask;
   b) providing first, second and third meniscus producing devices, each capable of developing a laminar flow of a photosensitive screen element slurry of phosphor particles and sized to fit between said mask support rails;
   c) developing a first laminar flow of the first photosensitive slurry over a meniscus producing surface;
   d) establishing a line of contact between said screening surface and said laminar flow;
   e) moving said line of contact so as to coat the first photosensitive slurry onto the screening surface to a depth of approximately 25 microns;
   f) exposing the first coated screening surface with light actinic to said first photosensitive slurry and developing the first coated screening surface to produce a first pattern of spaced screen elements fixed to said screening surface and removing unwanted slurry coating; and
   g) repeating steps c-f with second and third photosensitive slurries passing through the second and third meniscus producing devices, respectively.

12. The method of claim 4 including the step of providing an arcuate meniscus producing surface whose radius is substantially equal to the radius of the substantially cylindrical faceplate.

13. The method of claim 12 including the step of causing said line of contact to move in a curve whose radius is substantially equal to the radius of the substantially cylindrical faceplate.

* * * * *